(12) United States Patent
Kawahigashi

(10) Patent No.: US 7,733,154 B2
(45) Date of Patent: Jun. 8, 2010

(54) SEMICONDUCTOR DEVICE

(75) Inventor: Shougo Kawahigashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 18 days.

(21) Appl. No.: 12/155,709

(22) Filed: Jun. 9, 2008

(65) Prior Publication Data

US 2009/0009230 A1    Jan. 8, 2009

(30) Foreign Application Priority Data

Jul. 5, 2007    (JP)    ............................... 2007-177263

(51) Int. Cl.
*G03G 5/00*    (2006.01)
(52) U.S. Cl. ............................. 327/333; 326/62; 326/81
(58) Field of Classification Search ............. 326/62–63, 326/80–81; 327/306, 333
See application file for complete search history.

(56) References Cited

U.S. PATENT DOCUMENTS 6,097,214 A * 8/2000 Troussel et al. ............... 326/63
6,404,229 B1 * 6/2002 Barnes ......................... 326/68
7,112,996 B2 * 9/2006 Lee ............................. 326/68

FOREIGN PATENT DOCUMENTS

JP    11-225054    8/1999

* cited by examiner

*Primary Examiner*—Dinh T. Le
(74) *Attorney, Agent, or Firm*—McGinn IP Law Group, PLLC

(57) ABSTRACT

A semiconductor device includes a level shift circuit to convert an input signal having an amplitude from a first power supply potential to a second power supply potential to a signal having an amplitude from the first power supply potential to a third power supply potential, a first output portion to output voltage generated from the third power supply potential to an output terminal based on the output of the level shift circuit, the first output portion including a NMOS transistor, and a second output portion to output voltage generated from the third power supply potential to an output terminal based on the output of the level shift circuit, the second output portion including a PMOS transistor.

6 Claims, 5 Drawing Sheets

SEMICONDUCTOR DEVICE

BACKGROUND OF THE INVENTION

1. Field of the Invention

The present invention relates to a semiconductor device, in particular a semiconductor device having a level shift circuit and a voltage output circuit.

2. Description of Related Art

Conventionally, a driver circuit of a display device has been composed of a level shift circuit to convert a low amplitude level signal to a high amplitude level signal, and a voltage output circuit to apply high voltage to the display device based on the output of the level shift circuit. For example, Japanese Unexamined Patent Application Publication No. 11-225054 (Isobe et al.) describes a voltage output circuit in related art.

FIGS. 5 and 6 show a driver circuit described in Isobe et al. In FIG. 5, the voltage output circuit is composed of a CMOS type circuit, which is in turn composed of a P-channel type field effect transistor (called "PMOS transistor" hereinafter) and a N-channel type field effect transistor (called "NMOS transistor" hereinafter). Meanwhile, in FIG. 6, the voltage output circuit is composed of two NMOS transistors. In both cases, a voltage output circuit in the related art has circuit structure in which a single transistor is driven by one level shift circuit.

However, in the circuit shown in FIG. 5, the current load characteristic of the transistor in the voltage output circuit largely depends on the power supply potential. Therefore, the lower the power supply potential, the larger the current load characteristic becomes (see FIG. 8). Meanwhile, in the circuit shown in FIG. 6, owing to a zener diode Di inserted between the gate and source of the transistor of the voltage output circuit, the output potential is lower than the power supply potential VCC by an amount corresponding to the voltage drop VZ of the zener diode Di (see FIG. 7).

As explained above, in the case a PMOS transistor is used in the voltage output circuit of the driving circuit in the related art, the current load characteristic depends on the power supply potential, and therefore the lower the power supply potential, the larger the current load resistance becomes. Furthermore, in the case a NMOS transistor is used in the voltage output circuit, the output potential becomes lower than the power supply potential VCC.

SUMMARY

In one embodiment, the present invention provides a semiconductor device includes a level shift circuit to convert an input signal having an amplitude from a first power supply potential to a second power supply potential to a signal having an amplitude from the first power supply potential to a third power supply potential, a first output portion to output voltage generated from the third power supply potential to an output terminal based on the output of the level shift circuit, the first output portion including a NMOS transistor, and a second output portion to output voltage generated from the third power supply potential to the output terminal based on the output from the level shift circuit, the second output portion including a PMOS transistor.

According to the invention, by using both PMOS transistor and NMOS transistor in the upper portion of the voltage output circuit, a lower current load resistance characteristic can be achieved even if the power supply potential is low, and the output potential can be maintained at the power supply potential VCC.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
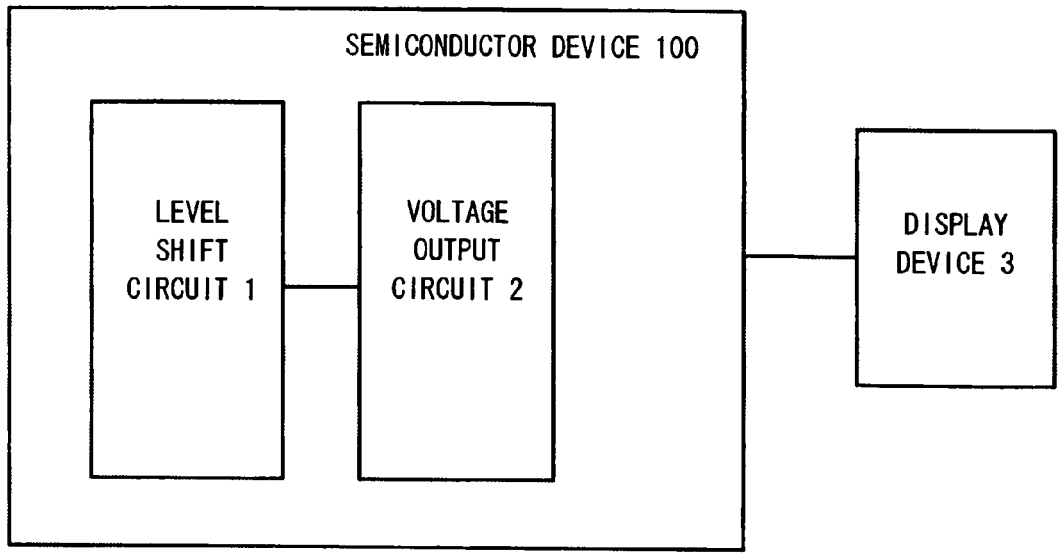
FIG. 1 is a block diagram of a semiconductor device 100 in accordance with a first embodiment of the present invention.

Embodiments in accordance with the present invention are explained hereinafter with reference to the drawings. FIG. 1 is a block diagram of a semiconductor device in accordance with a first embodiment of the present invention. As shown in FIG. 1, a semiconductor device 100 in accordance with this embodiment includes a level shift circuit 1 and a voltage output circuit 2. Furthermore, the voltage output circuit 2 is connected to a display device 3. The level shift circuit converts a low amplitude level signal, for example, in the order of 3 V to 5 V to a high amplitude level signal in the order of 50 V to 200 V. The voltage output circuit 2 applies high voltage to the display device 3 based on the output of the level shift circuit 1. The embodiment in accordance with the present invention having such structure is explained hereinafter in a more detailed manner.

Figure 2:
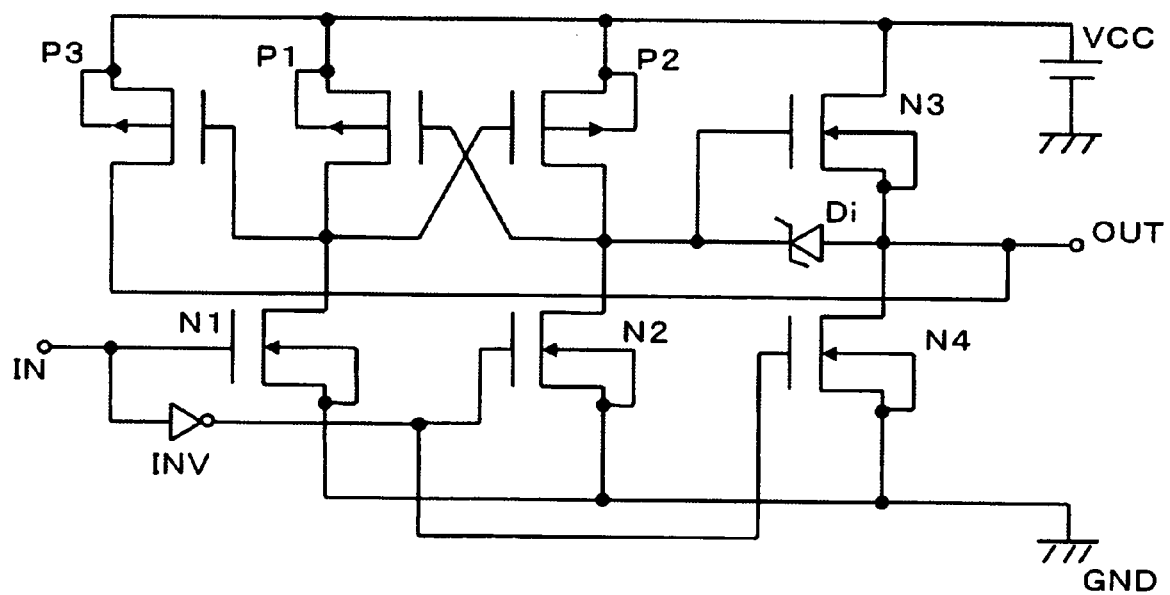
FIG. 2 is a circuit diagram showing more detailed structure of the semiconductor device 100 shown in FIG. 1.

FIG. 2 shows more detailed structure of the semiconductor device 100 shown in FIG. 1. As shown in FIG. 2, the semiconductor device 100 in accordance with this embodiment includes an inverter INV, transistors P1-P3 and N1-N4, and a zener diode Di. Firstly, the connections of the level shift circuit 1 are explained with reference to FIG. 2.

An input terminal IN, from which in an input signal having an amplitude from a first power supply potential (called "ground potential" hereinafter) to a second power supply potential is inputted, is connected to the gate (control terminal) of the NMOS transistor N1, and the source of the NMOS transistor N1 is connected to the ground potential. Furthermore, the drain of the NMOS transistor N1 is connected to the gate of the PMOS transistor P2. The source of the PMOS transistor P2 is connected to a third power supply potential (called "power supply potential VCC" hereinafter), and the drain of the PMOS transistor P2 is connected to the gate of the NMOS transistor N3 and the cathode electrode of the zener diode Di. The input terminal IN is also connected to the gate of the NMOS transistor N2 through the inverter INV. The source of the NMOS transistor N2 is connected to the ground potential, and the drain of the NMOS transistor N2 is connected to the gate of the PMOS transistor P1. The source of the PMOS transistor P1 is connected to the power supply potential VCC, and the drain of the PMOS transistor P1 is connected to the gate of a first output portion (which is called "PMOS transistor P3" hereinafter). Furthermore, the PMOS transistor P1 and NMOS transistor N1 are connected in series, and the PMOS transistor P2 and NMOS transistor N2 are also connected in series.

The source of the PMOS transistor P3 is connected to the power supply potential VCC, and the drain of the PMOS transistor P3 is connected to an output terminal OUT. The drain of the NMOS transistor N3 is connected to the power supply potential VCC, and the source of the NMOS transistor N3 is connected to the anode electrode of the zener diode Di and the output terminal OUT. Furthermore, the input terminal IN is also connected to the gate of the NMOS transistor N4 through the inverter INV. Furthermore, the source of the NMOS transistor N4 is connected to the ground potential, and the drain of the NMOS transistor N4 is connected to the anode electrode of the zener diode Di and the output terminal OUT. Incidentally, the NMOS transistor N3 and zener diode Di constitutes a second output portion.

In the circuit shown in FIG. 2, the level shift circuit 1 shown in FIG. 1 is materialized mainly by the PMOS transistors P1 and P2, NMOS transistors N1 and N2, and inverter INV.

Furthermore, the voltage output circuit 2 is materialized mainly by the PMOS transistors P3, NMOS transistors N3 and N4, and zener diode Di. Specific operation of the semiconductor device in accordance with this embodiment is explained hereinafter in a more detailed manner with reference to FIG. 2.

A "Low" level signal, which corresponds to the first power supply potential, is inputted to the input terminal IN. This "Low" level signal has the lower side potential of the input signal, and is ground potential in this embodiment. At this point, the NMOS transistor N1 becomes the off-state. Furthermore, since the inverted signal is inputted to the NMOS transistor N2 through the inverter INV, it becomes the on-state. Therefore, since the ground potential is provided to the gate of the PMOS transistor P1, the PMOS transistor P1 becomes the on-state. Furthermore, since the PMOS transistor P1 becomes the on-state, the power supply potential VCC is provided to the gate of the PMOS transistor P2, and thereby the PMOS transistor P2 becomes the off-state.

Furthermore, since the power supply potential VCC is provided to the gate of the PMOS transistor P3, the PMOS transistor P3 becomes the off-state. Furthermore, since the ground potential is provided to the gate of the NMOS transistor N3, the NMOS transistor N3 becomes the off-state. Since "High" level is inputted to the gate of the NMOS transistor N4 through the inverter INV, the NMOS transistor N4 becomes the on-state. Incidentally, since the anode terminal and cathode terminal of the zener diode Di are both at the same potential, namely at the ground potential, the zener diode Di becomes a non-conducting state. Therefore, the ground potential is outputted from the output terminal OUT.

Furthermore, a "High" level signal, which corresponds to the second power supply potential, is inputted to the input terminal IN. This "High" level signal has the higher side potential of the input signal, and is higher than the threshold voltage of the NMOS transistor N1 but lower than the power supply potential VCC. At this point, a "High" level signal is inputted to the gate of the NMOS transistor N1, and a "Low" level signal is inputted to the gates of the NMOS transistors N2 and N4 through the inverter INV. Consequently, the NMOS transistor N1 becomes the on-state, and the NMOS transistors N2 and N4 become the off-states. Therefore, since the ground potential is provided to the gate of the PMOS transistors P2 and P3, the PMOS transistors P2 and P3 become the on-states. Since power supply potential VCC is provided to the gate of PMOS transistor P1, the PMOS transistor P1 becomes the off-state.

At this point, since the PMOS transistor P3 becomes the on-state, the power supply potential VCC is outputted from the output terminal OUT. When the power supply potential VCC is high, the gate of the NMOS transistor N3 and the cathode of the zener diode Di become the power supply potential VCC by the PMOS transistor P2. Since all loads that are connected to the PMOS transistor P2 are these two components alone, they do not cause any voltage drop. Meanwhile, the source of the NMOS transistor N3 and the anode of the zener diode Di become the power supply potential VCC by the PMOS transistor P3. A temporary voltage drop may occur depending on the load of the output terminal OUT, which is connected to the source of the NMOS transistor N3 and the anode of the zener diode Di. However, since the resistance of the PMOS transistor P3 is sufficiently low in the area where the power supply potential VCC is sufficiently high, e.g., equal to or larger than 5.0 V (see FIG. 8), it rises to voltage substantially equal to the power supply potential VCC within a finite length of time. Since voltage difference across the anode and cathode of the zener diode Di become substantially zero at that point, voltage difference between the gate and source of the NMOS transistor N3, which are connected to the anode and cathode of the zener diode Di respectively, also becomes substantially zero, and thereby the NMOS transistor N3 becomes the off-state. That is, the circuit in accordance with one embodiment of the present invention can output a signal having potential substantially equal to the power supply potential VCC in the area where the power supply potential VCC is high.

Meanwhile, the voltage of the power supply potential VCC outputted from the output terminal OUT changes in response to the display device. A case where the power supply potential VCC in a low voltage area, e.g., in the order of 2.3 V to 5.0 V, is outputted from the output terminal OUT is explained hereinafter.

Figure 8:
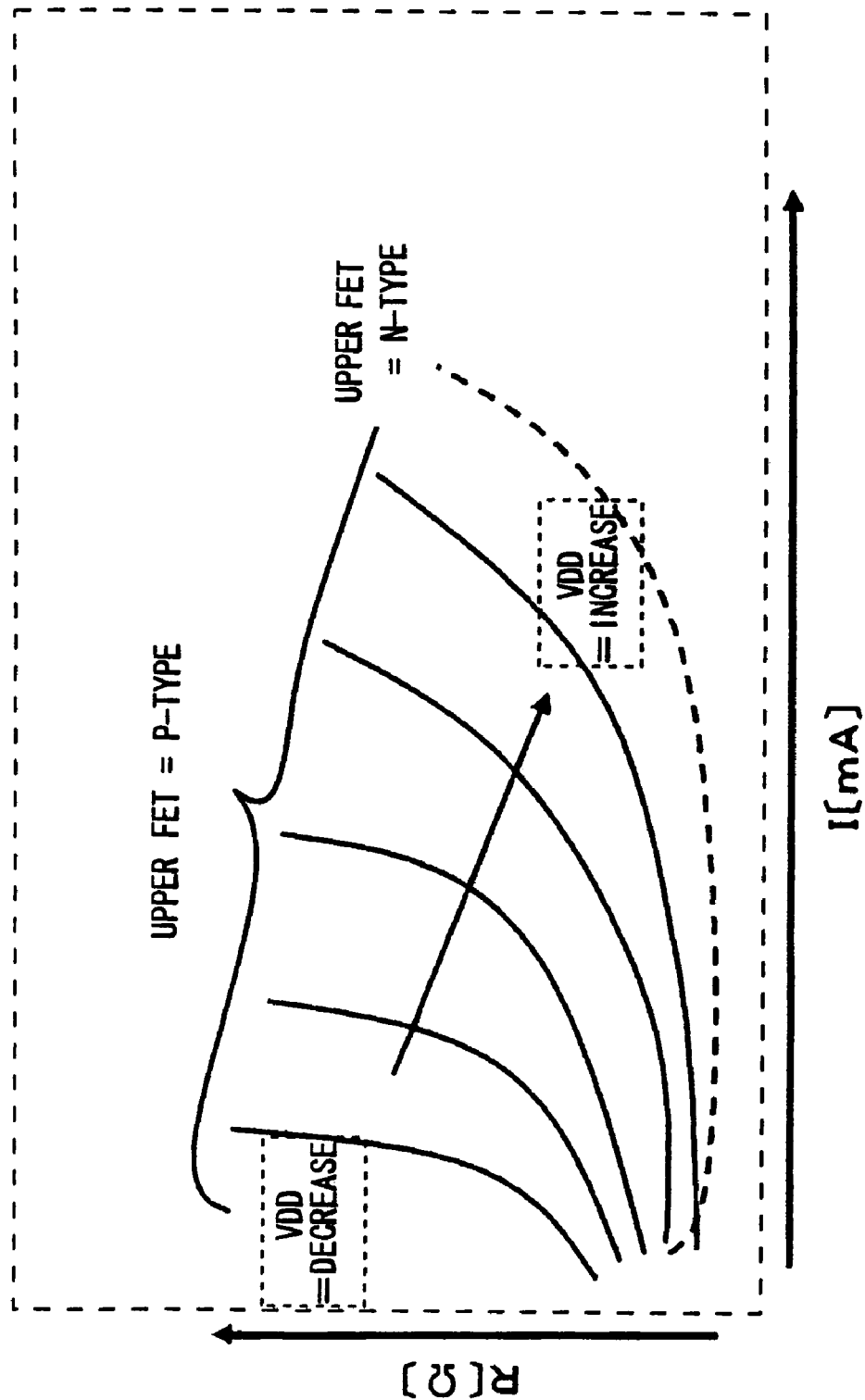
FIG. 8 shows the current load characteristic of a transistor in the voltage output circuit in the related art.

The more the power supply potential VCC decreases as shown as "VDD decrease" in FIG. 8, the more the ON resistance of the PMOS transistor P3 increases. Even if the ON resistance of the PMOS transistor P3 increases and the voltage drop by the PMOS transistor P3 becomes larger than the zener voltage VZ of the zener diode Di, the NMOS transistor N3 becomes the on-state. Therefore, even if the ON resistance of the PMOS transistor P3 increases, the voltage drop by its ON resistance never increases to or larger than VZ. At this state, the power supply potential VCC is supplied to the output terminal OUT from both PMOS transistor P3 and NMOS transistor N3.

Figure 4:
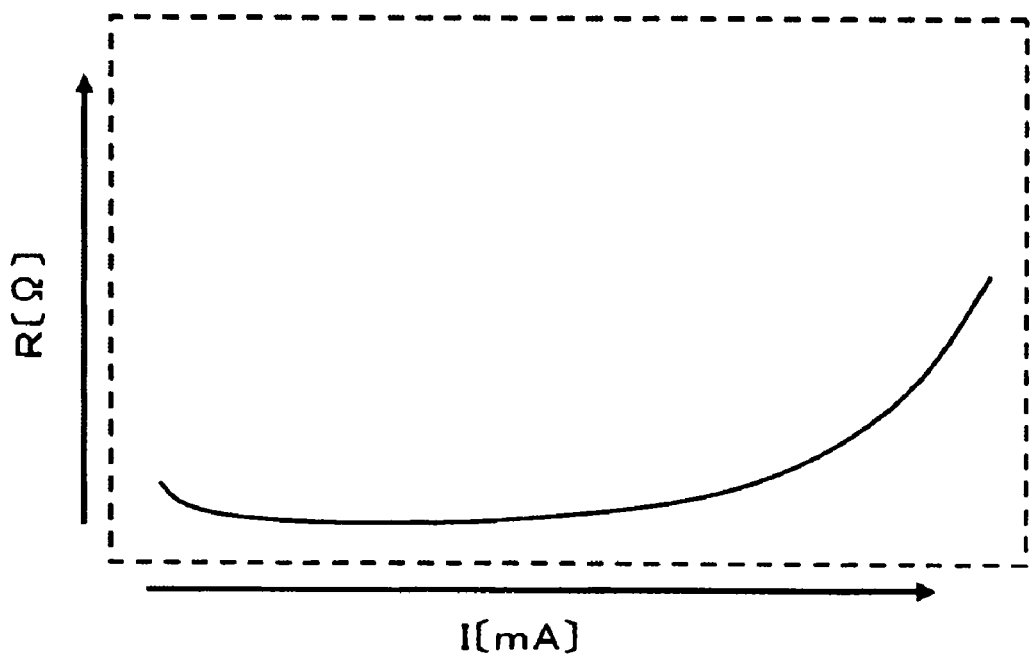
FIG. 4 shows the current load characteristic of a transistor in the voltage output circuit in accordance with the first embodiment of the present invention.
Figure 5:
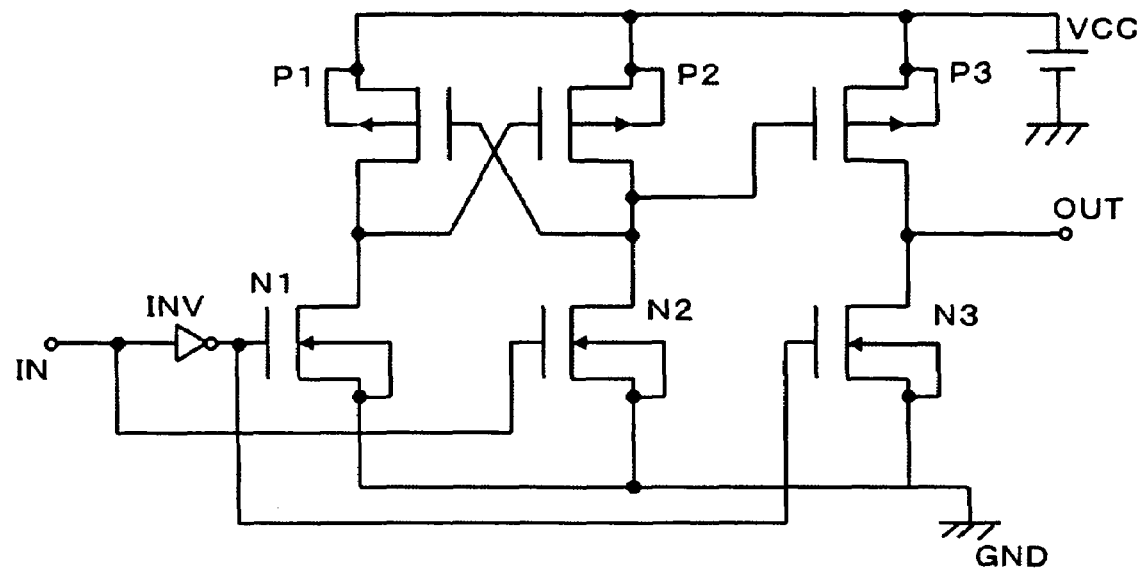
FIG. 5 shows a semiconductor device in the prior art.
Figure 6:
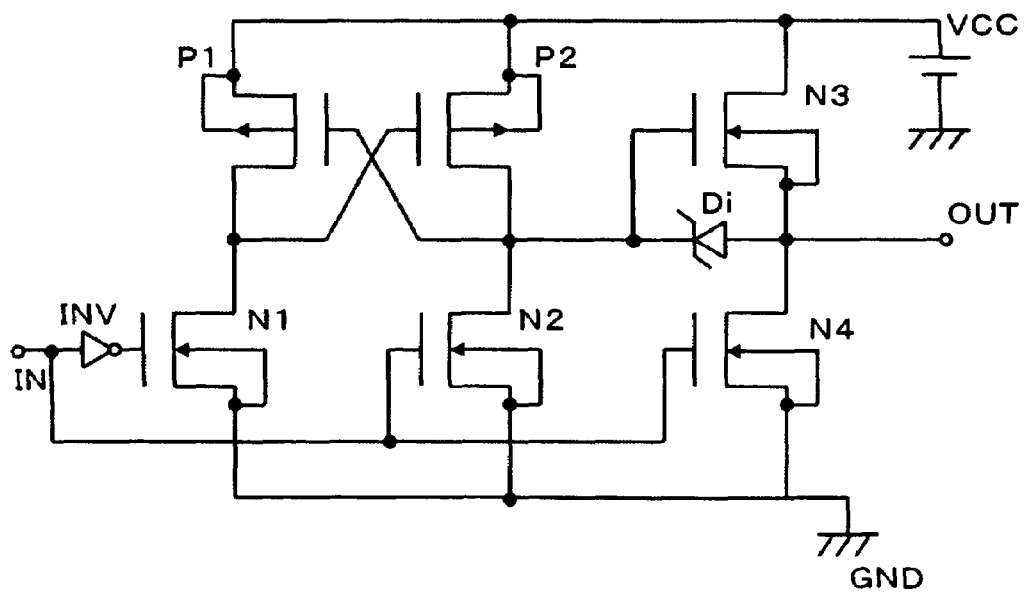
FIG. 6 shows a semiconductor device in the prior art.

Behaviors of the circuit during a transition period, such as when the power supply potential VCC is just turned on, are discussed hereinafter. For example, in a period immediately after the power supply potential VCC is turned on, during which the power supply potential VCC is not sufficiently high, the drive circuit in the prior art shown in FIG. 5 takes a long time before the output conforms to the power supply potential VCC because the output current is small and the ON resistance of the PMOS transistor is high. However, in the drive circuit in accordance with this embodiment, the output voltage can be mostly generated by the NMOS transistor N3, which has lower ON resistance, until the output voltage reaches VCC-VZ after the power supply potential VCC is tuned on. Meanwhile, although the NMOS transistor N3 becomes the off-state after the output voltage reaches VCC-VZ, the PMOS transistor P3 can raise the output voltage to voltage nearly equal to the power supply potential VCC. FIGS. 4 and 8 show waveforms showing the ON resistances and the operations during the transition period.

In this manner, by utilizing the characteristic of the NMOS transistor N3 for the transistor of the voltage output circuit, lower ON resistance characteristic can be achieved even in the situation where voltage of the power supply potential VCC is low.

Figure 3:
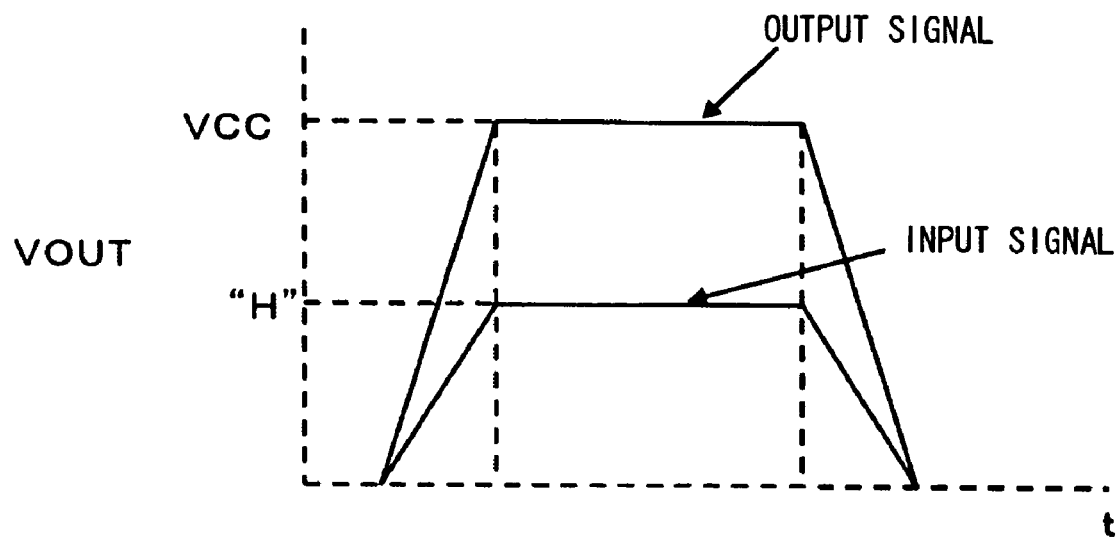
FIG. 3 shows an input waveform and an output waveform of a semiconductor device in accordance with the first embodiment of the present invention.
Figure 7:
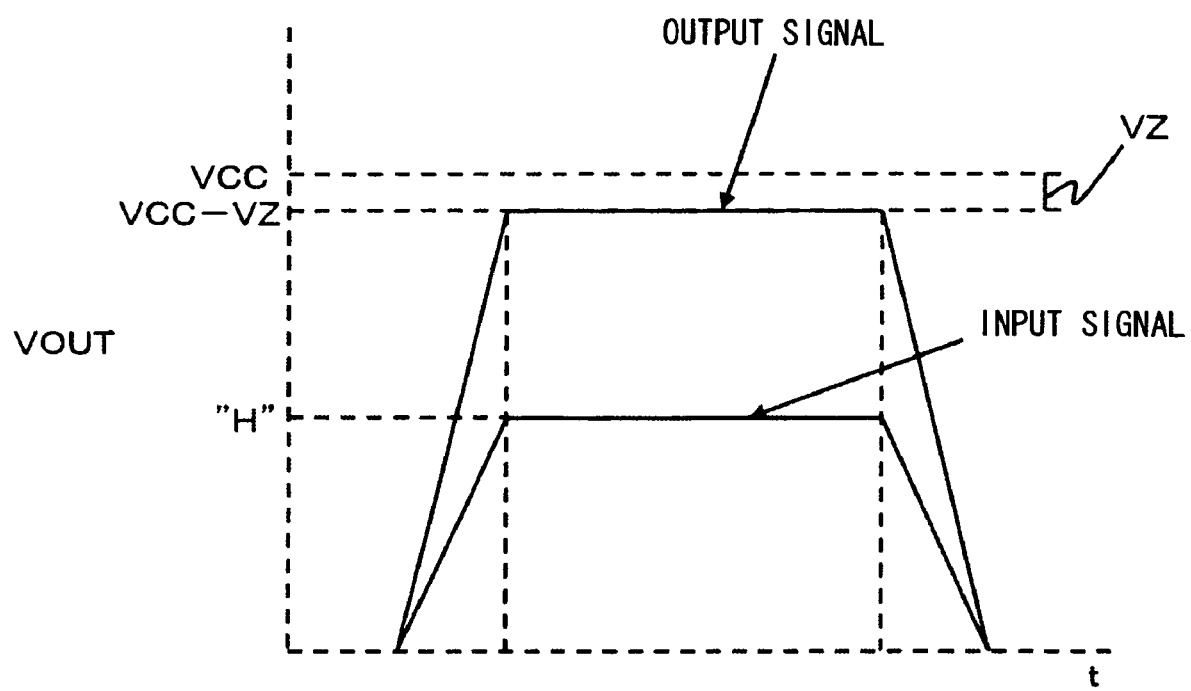
FIG. 7 shows an input waveform and an output waveform of a semiconductor device in the related art.

Furthermore, since PMOS transistor P3 is also used as the transistor of the voltage output circuit, the output potential is not decreased by the amount corresponding to the voltage drop VZ of the zener diode Di that is inserted between the gate and source of the NMOS transistor N3, and can be maintained at the power supply potential VCC (see FIGS. 3 and 7).

In this manner, the use of both PMOS transistor and NMOS transistor as the transistors of the voltage output circuit can make up for the disadvantages that will occur when only either one of the transistors is used.

It is apparent that the present invention is not limited to the above embodiments, but may be modified and changed without departing from the scope and spirit of the invention.

What is claimed is:

1. A semiconductor device comprising:
   a level shift circuit to convert an input signal having an amplitude from a first power supply potential to a second power supply potential to a signal having an amplitude from the first power supply potential to a third power supply potential at a first node and a second node;
   a first output portion to output voltage generated from the third power supply potential to an output terminal based on the output of the level shift circuit, the first output portion including an NMOS transistor coupled between the first node and the third power supply potential; and
   a second output portion to output voltage generated from the third power supply potential to the output terminal based on the output of the level shift circuit, the second output portion including a PMOS transistor coupled between said first node and the third supply potential and having a gate being controlled by the second node.

2. The semiconductor device according to claim 1, wherein the first, output portion includes a diode element connected between the control terminal of the NMOS transistor and the output terminal.

3. The semiconductor device according to claim 2, wherein the diode element is a zener diode.

4. A semiconductor device comprising:
   a level shift circuit to output signals at a first node and a second node, the level of the signals being converted in response to an input signal;
   a plurality of first-conductivity-type field effect transistors arranged in series between a higher power supply and a lower power supply and coupled to said first node; and
   a second-conductivity-type field effect transistor arranged between the higher power supply and the first node which is located between the plurality of first-conductivity-type field effect transistors and the higher power supply, the second-conductivity-type field effect transistor being controlled in response to the second node of the level shift circuit.

5. The semiconductor device according to claim 4, wherein the first output portion includes a diode element connected between the control terminal of the NMOS transistor and the output terminal.

6. The semiconductor device according to claim 5, wherein the diode element is a zener diode.

* * * * *